(12) United States Patent
Davies (10) Patent No.: US 7,078,784 B2
(45) Date of Patent: Jul. 18, 2006

(54) SEMICONDUCTOR DEVICE WITH INDUCTIVE COMPONENT AND METHOD OF MAKING

(76) Inventor: Robert B. Davies, 433 E. McKinley St, Tempe, AZ (US) 85281-1026

( * ) Notice: Subject to any disclaimer, the term of this patent is extended or adjusted under 35 U.S.C. 154(b) by 0 days.

(21) Appl. No.: 10/859,674

(22) Filed: Jun. 3, 2004

(65) Prior Publication Data

US 2004/0217443 A1    Nov. 4, 2004

Related U.S. Application Data

(63) Continuation of application No. 09/920,222, filed on Aug. 1, 2001.

(51) Int. Cl.
*H01L 29/00*    (2006.01)

(52) U.S. Cl. .................. 257/531; 257/277; 257/622
(58) Field of Classification Search ................ 257/531, 257/277, 622
See application file for complete search history.

(56) References Cited

U.S. PATENT DOCUMENTS

| 3,881,244 A | * | 5/1975 | Kendall | 29/602.1 |
| 4,169,000 A | * | 9/1979 | Riseman | 438/422 |
| 5,336,921 A | * | 8/1994 | Sundaram et al. | 257/531 |
| 6,030,877 A | * | 2/2000 | Lee et al. | 438/381 |
| 6,114,937 A | * | 9/2000 | Burghartz et al. | 336/200 |
| 2003/0170989 A1 | * | 9/2003 | Bothra | 438/689 |

FOREIGN PATENT DOCUMENTS

JP    06120036 A  *  4/1994

* cited by examiner

*Primary Examiner*—Eugene Lee
(74) *Attorney, Agent, or Firm*—Parsons & Goltry; Robert A. Parsons; Michael W. Goltry (57) ABSTRACT

An integrated circuit (10) includes a semiconductor substrate (11) that has a top surface (32) for forming a dielectric region (14) with a trench (40) and one or more adjacent cavities (16). A conductive material such as copper is disposed within the trench to produce an inductor (50). A top surface (49) of the inductor is substantially coplanar with an interconnect surface (31) of the semiconductor substrate, which facilitates connecting to the inductor with standard integrated circuit metallization (57).

23 Claims, 13 Drawing Sheets

SEMICONDUCTOR DEVICE WITH INDUCTIVE COMPONENT AND METHOD OF MAKING

This is a CON of 09/920,222 filed Aug. 1, 2001.

BACKGROUND OF THE INVENTION

The present invention relates in general to semiconductor devices and, more particularly, to integrated circuits formed with inductive components such as planar inductors and transformers.

Many semiconductor devices integrate both active and passive components on the same die in order to reduce the manufacturing cost of electronic systems. For example, many wireless communication systems are fabricated with an integrated circuit that includes a low noise radio frequency input amplifier and a bandpass or impedance matching filter formed on the same semiconductor die. The filter often includes a planar inductor or transformer which is integrated on the semiconductor die along with the amplifier's active transistors.

However, most integrated electromagnetic devices such as inductors suffer from a low quality factor owing to a low resistivity semiconductor substrate used to avoid a latchup condition of the integrated circuit. The proximity of the inductor to the low resistivity substrate induces parasitic image currents in the substrate that load the inductor and reduce its quality factor. Moreover, the semiconductor material used to form the substrate typically has a high dielectric constant which produces a high parasitic capacitance of the inductor, which reduces its frequency response and degrades the performance of the integrated circuit.

Hence, there is a need for an integrated circuit and method of fabrication that provides a high quality factor inductive component in order to maintain a low system cost and a high performance of the integrated circuit.

DETAILED DESCRIPTION OF THE DRAWINGS

In the figures, elements having the same reference numbers have similar functionality.

Figure 1:
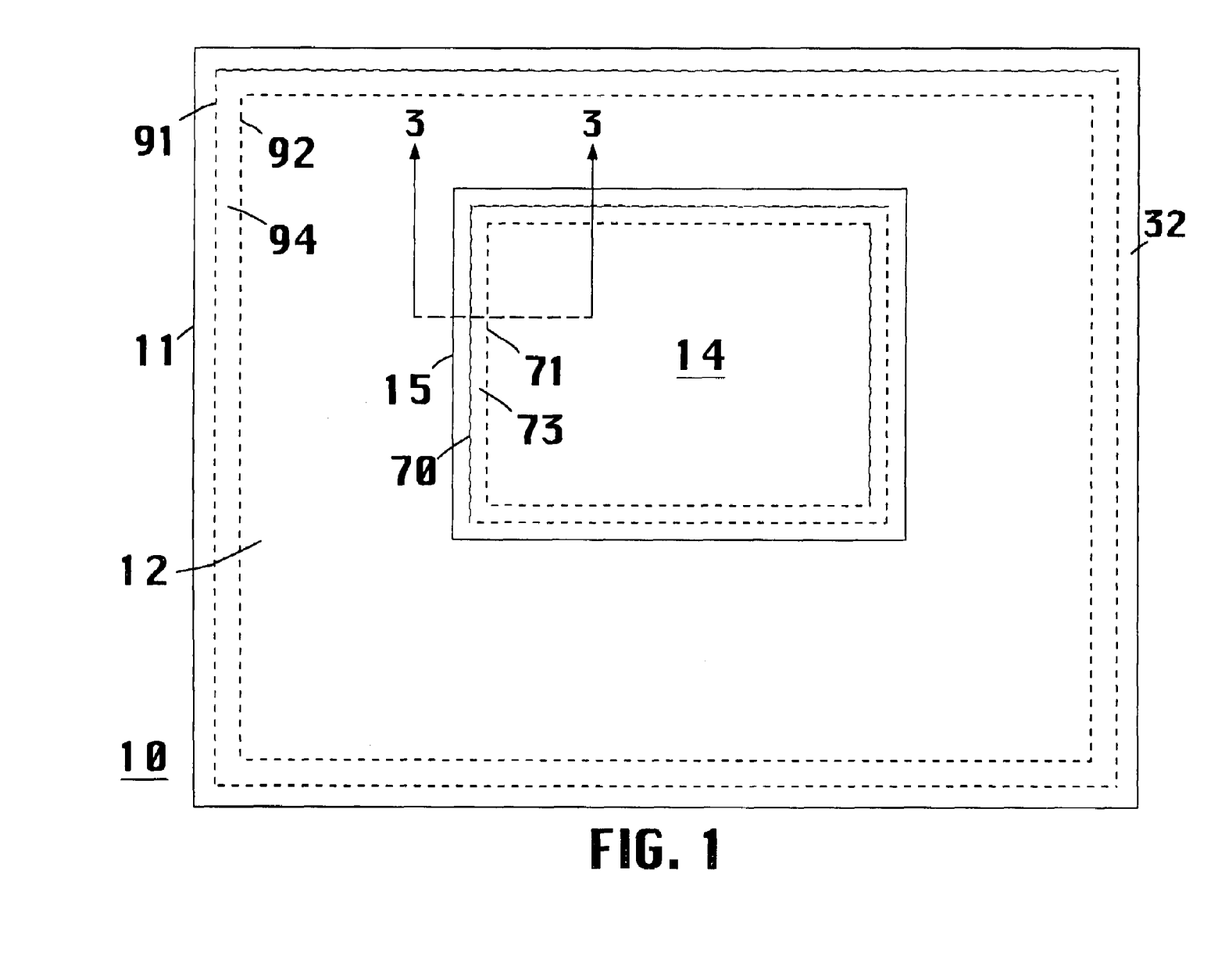
FIG. 1 shows a top view of an integrated circuit.

FIG. 1 is a top plan view of an integrated circuit 10, showing a semiconductor substrate 11 having a top surface 32 for defining an active region 12 and a low permittivity dielectric region 14. Active region 12 is formed with active circuitry that includes transistors and/or other active components. Components of integrated circuit 10 are configured to operate at a frequency of at least six gigahertz. In one embodiment, substrate 11 is formed with silicon.

Dielectric region 14 is formed within a boundary 15 of an insulating material having a reduced permittivity structure. Hence, dielectric region 14 is ideal for forming passive components such as inductors which have a low parasitic capacitance and a high degree of electrical isolation from substrate 11, and therefore a high quality factor and frequency response. A recessed region 76 is defined by edges 70 and 71 of a surface 73 formed on a bottom surface of substrate 11 as described below to further enhance the quality factor of passive components formed on dielectric region 14.

A recessed region 93 is used to align integrated circuit 10 on a die attach flag with other similarly configured semiconductor dice to provide a circuit with multiple interconnected semiconductor dice. Recessed region 93 has a sloped edge defined by corners or edges 91 and 92 as described in further detail below.

Figure 2:
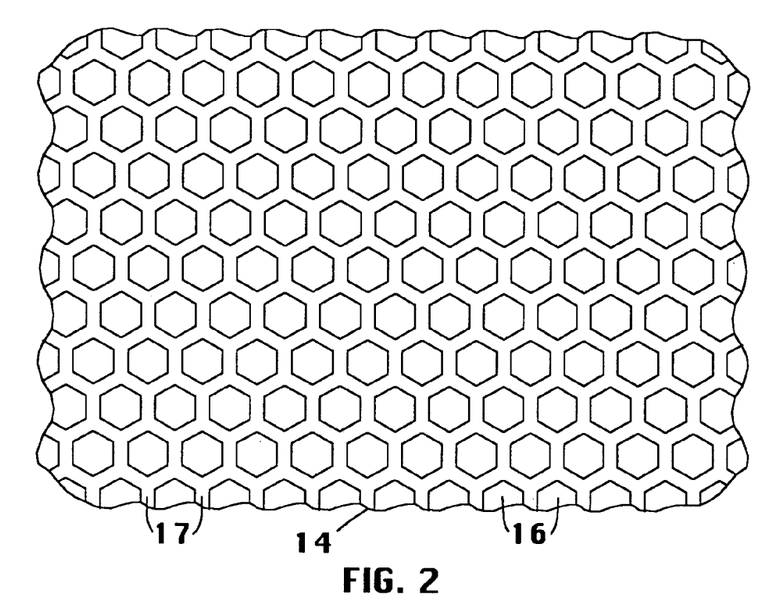
FIG. 2 shows a top view of a portion of a dielectric region of the integrated circuit.

FIG. 2 is a top view of integrated circuit 10 showing a portion of dielectric region 14 in further detail. A dielectric material 17 is formed on substrate 11 so as to define an array of holes or cavities 16. Cavities 16 typically are filled with a gaseous material or vacuum which has a low dielectric constant, thereby reducing the effective permittivity and enhancing the frequency response of components formed on dielectric region 14. Dielectric material 17 is preferably formed to a depth of at least five micrometers in order to electrically isolate passive components from being loaded by substrate 11. In one embodiment, dielectric material 17 comprises thermally grown silicon dioxide formed to a depth of about thirty micrometers and formed in accordance with a method disclosed in pending U.S. patent application Ser. No. 09/527,281, filed on Mar. 17, 2000 by the same inventor, Robert B. Davies, and entitled "Die Attachment and Method". The effective width of cavities 16 is about 1.2 micrometers and cavities 16 are separated by dielectric material 17 having a typical width of 0.4 micrometers.

Passive components such as inductors and transformers often occupy a large die area. To accommodate these passive components, the die area occupied by dielectric region 14 is similarly large. For example, in one embodiment, dielectric region 14 occupies a die area of about one hundred thousand square micrometers. Therefore, dielectric region 14 is formed with dielectric material 17 comprising thermally grown silicon dioxide, which has a high mechanical strength in order to resist cracking during the manufacturing process and while operating integrated circuit 10 over its specified temperature range.

Figure 3:
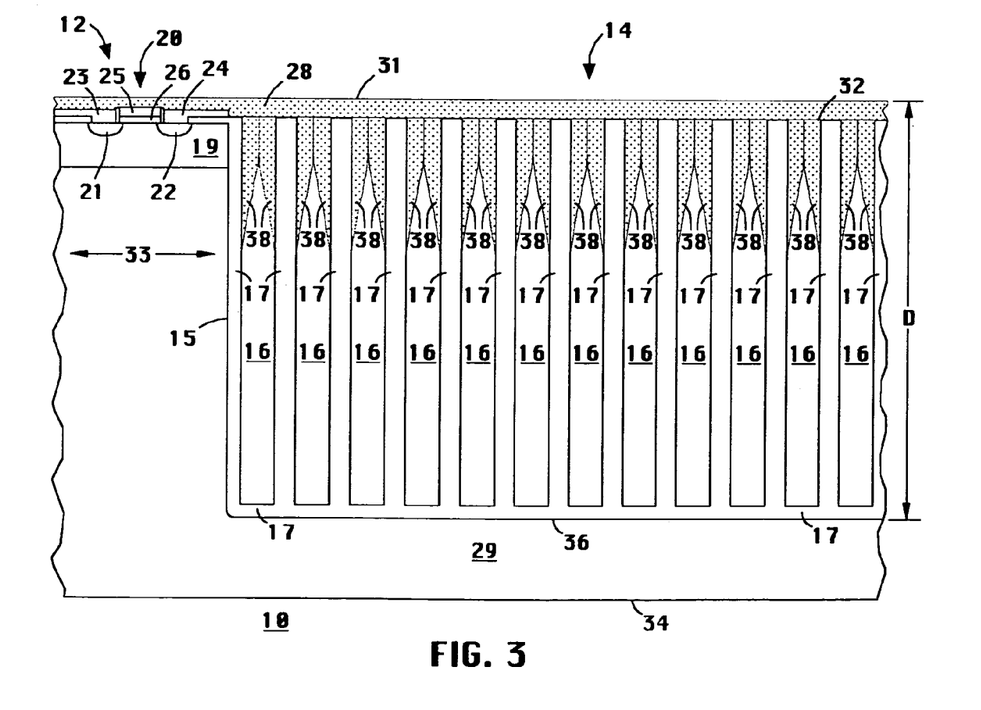
FIG. 3 shows a cross-sectional view of a selected portion of the integrated circuit after a first processing step.

FIG. 3 is a cross-sectional view of a selected portion of integrated circuit 10, showing details of active region 12 and dielectric region 14 after a first processing step. A region 29 is formed adjacent to a bottom surface 34 of substrate 11 with a low resistivity p-type semiconductor material, which provides a low minority carrier lifetime that avoids a latchup condition of integrated circuit 10. In one embodiment, region 29 has a resistivity of about 0.01 ohm-centimeters. An epitaxial region 19 is formed to overlie region 29 and extend to top surface 32. Epitaxial region 19 comprises a higher resistivity p-type semiconductor material suitable for forming active circuitry. In one embodiment, epitaxial region 19 has a resistivity of about ten ohm-centimeters.

Active region 12 includes a transistor 20 operating as an n-channel metal oxide semiconductor field effect transistor. Heavily doped n-type regions 21 and 22 are formed at top surface 32 within epitaxial region 19 to function as a source 21 and drain 22 of transistor 20, respectively. A conductive material such as doped polysilicon is formed on top surface 32 to function as a source electrode 23 and a drain electrode 24 for providing electrical contact to source 21 and drain 22, respectively. A layer of conductive material is disposed over a gate dielectric 26 as shown to function as a control or gate electrode 25 of transistor 20. In one embodiment, transistor 20 is a component of a high frequency amplifier operating at about six gigahertz.

Dielectric region 14 is formed by selectively etching semiconductor material from substrate 11 to form an array of columnar openings and then thermally oxidizing the remaining semiconductor material to form dielectric material 17 to define sidewalls of cavities 16. In one embodiment, dielectric material 17 extends within substrate 11 from surface 32 to a surface 36 to a depth D=30.0 micrometers. A cap layer 38 is formed by depositing a semiconductor oxide material to seal off cavities 16. Devices in active region 12, such as transistor 20, typically are fabricated after dielectric material 17 is thermally formed in order to avoid subjecting these active devices to high temperatures that could adversely modify their performance.

Cavities 16 typically contains a gaseous material such as air that has a dielectric constant approaching one. In one embodiment, dielectric material 17 comprises thermally grown silicon dioxide, which has a dielectric constant of about 3.8. When combined with the effective relative permittivity of about 1.0 that characterizes cavities 16, the overall effective relative permittivity or dielectric constant of dielectric region 14 is about 2.5.

Figure 4:
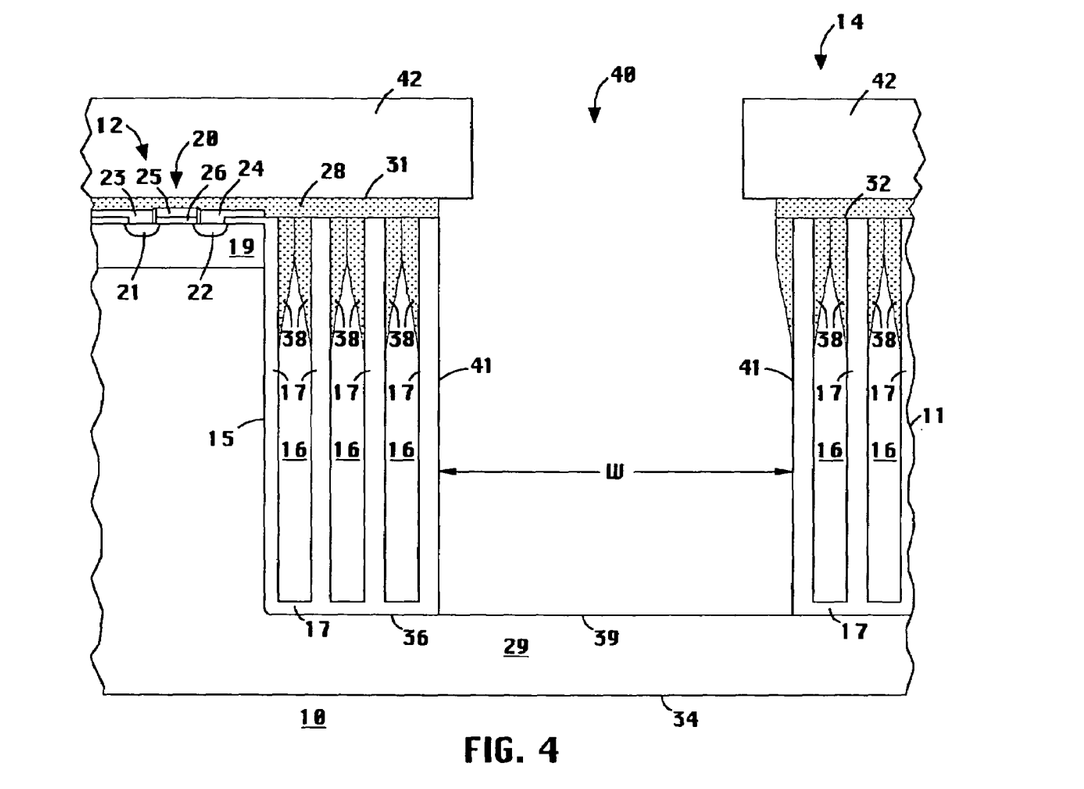
FIG. 4 shows a cross-sectional view of the selected portion of the integrated circuit after a second processing step.

An interlevel dielectric layer 28 is formed over top surface 32 to overlie active region 12 and dielectric region 14. In one embodiment, dielectric layer 28 comprises silicon dioxide deposited to a thickness of about five thousand angstroms between top surface 32 and an interconnect surface 31 of dielectric layer 28. Dielectric layer 28 may be subjected to a chemical mechanical polishing or similar process to provide a high degree of planarity of surface 31. FIG. 4 is a cross-sectional view of the selected portion of integrated circuit 10 after a second processing step. A photoresist layer 42 is formed over surface 31 and patterned as shown. Integrated circuit 10 is then subjected to a standard anisotropic etch to remove material from dielectric layer 28 and cap layer 38 sufficient to open up those cavities 16 which are not covered by photoresist layer 42. An isotropic etching step is then used to selectively remove sidewall material from the opened cavities 16 to form a trench 40. In one embodiment, dielectric region 14 comprises silicon dioxide, and an etchant with a high selectivity for silicon dioxide over silicon is used. Hence, region 29 functions as an etch stop to ensure that a bottom surface 39 of trench 40 is adjacent to region 29. In one embodiment, trench 40 is formed to a width W of about thirty micrometers.

To ensure that dielectric material 17 is completely removed from bottom surface 39 so that region 29 is exposed, the isotropic etching step is timed to slightly overetch dielectric material 17. As a result, one or two rows of cavities 16 that underlie photoresist layer 42 may be removed and sidewalls 41 may not be perfectly vertical in shape. Since the width of dielectric material between cavities 16 is about 0.4 micrometers while the width of trench 40 is much greater, e.g., thirty micrometers, a small degree of overetching is not considered deleterious and can increase the effective surface area of trench 40 over what would be achieved if sidewalls 41 were perfectly vertical. The increased surface area has an advantage of reducing the effective resistance of an embedded conductor, particularly when the resistance is determined by the skin effect such as when operating at a high frequency greater than about one gigahertz.

To obtain the benefits of low relative permittivity, dielectric region 14 is formed to extend beyond the area occupied by trench 40 so that one or more cavities 16 lies adjacent to trench 40. In one embodiment, cavities 16 are considered to lie adjacent to trench 40 where the effective dielectric constant of dielectric region 14 is at least ten percent lower than the dielectric constant of dielectric material 17.

Figure 5:
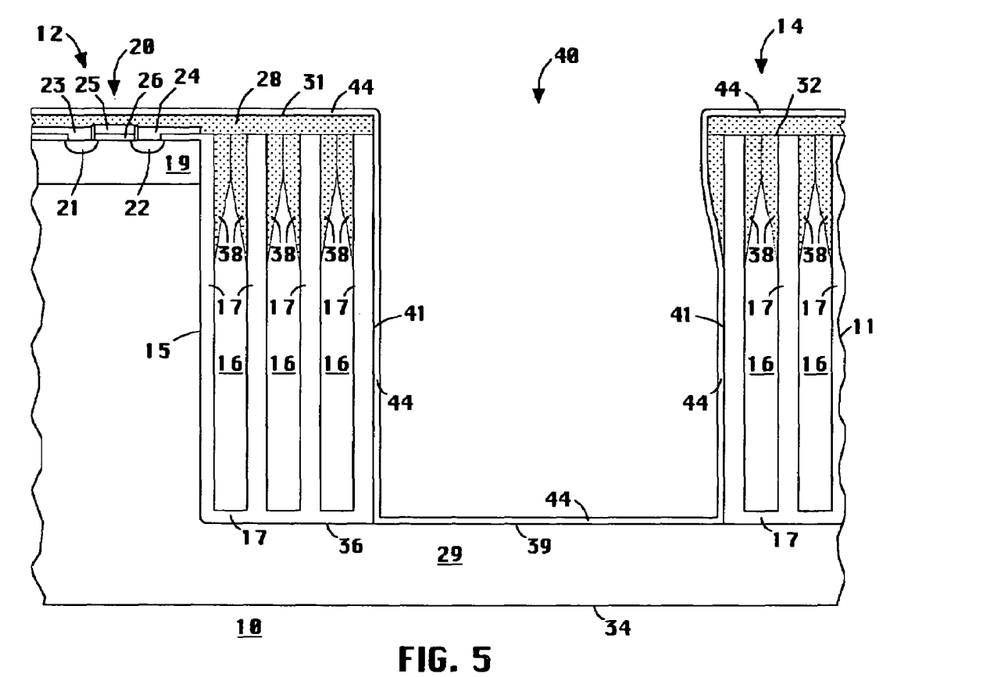
FIG. 5 shows a cross-sectional view of the selected portion of the integrated circuit after a third processing step.

FIG. 5 is a cross-sectional view of the selected portion of integrated circuit 10 after a third processing step. Photoresist layer 42 is removed and a conductive layer 44 is deposited to a thickness of about five hundred angstroms to cover surface 31 as well asسidewalls 41 and bottom surface 39 of trench 40. In one embodiment, layer 44 is formed with a metal such as platinum, titanium or cobalt which can combine with silicon to form a silicide.

Figure 6:
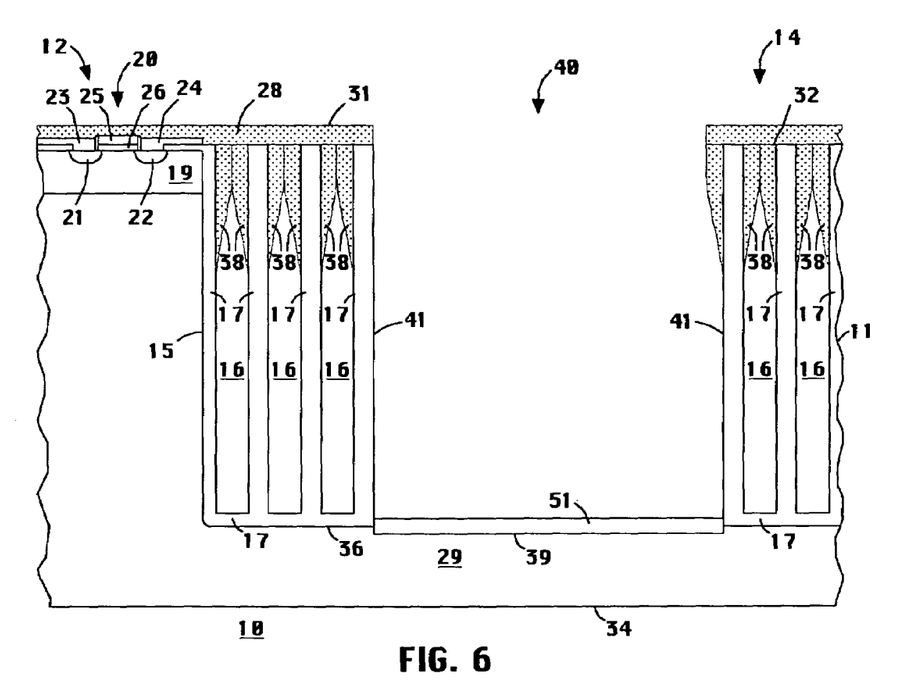
FIG. 6 shows a cross-sectional view of the selected portion of the integrated circuit after a fourth processing step.

FIG. 6 is a cross-sectional view of the selected portion of integrated circuit 10 after a fourth processing step. Integrated circuit 10 is subjected to an etching step that removes layer 44 from regions adjacent to surface 31 and sidewalls 41. Along bottom surface 39 of trench 40, the conductive material used to form layer 44 combines with semiconductor material from region 29 to form a silicide layer 51 that is resistant to the etching step. In one embodiment, platinum is used to form layer 44, region 29 is formed with silicon, and the etching step is performed using an aqua regia or similar etchant. The aqua regia etchant removes elemental platinum from regions adjacent to surface 31 and sidewalls 41, but the platinum adjacent to bottom surface 39 combines with silicon from region 29 to form conductive platinum silicide which functions as silicide layer 51 which is not removed by the aqua regia etch.

Figure 7:
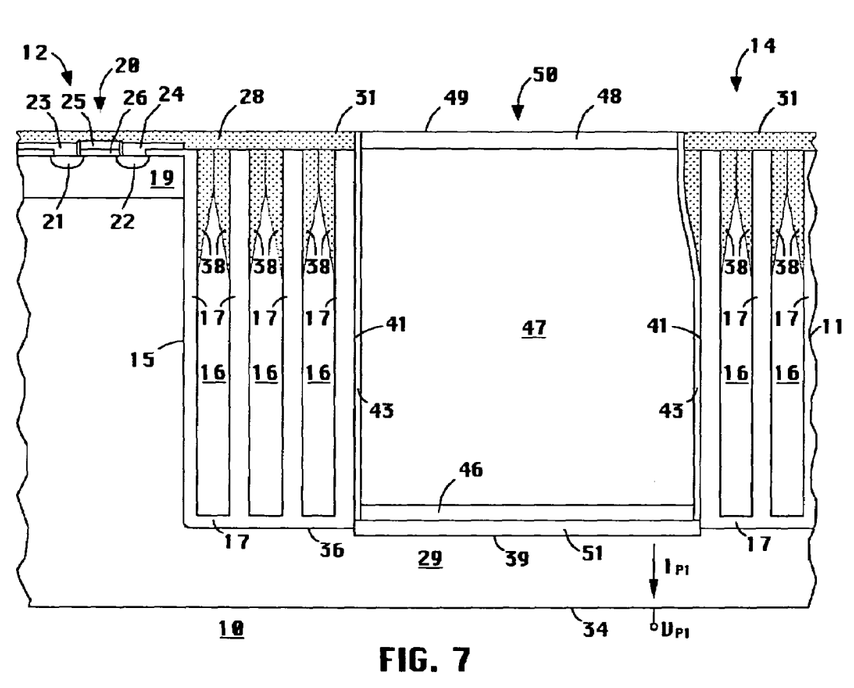
FIG. 7 shows a cross-sectional view of the selected portion of the integrated circuit after a fifth processing step.

FIG. 7 is a cross-sectional view of the selected portion of integrated circuit 10 after a fifth processing step. A thin dielectric material is deposited over integrated circuit 10 and then anisotropically etched to form spacers 43 along sidewalls 41 of trench 40. In one embodiment, spacers 43 are formed with silicon nitride to a thickness of about two thousand angstroms.

To ensure an adequate barrier for subsequent etching processes, a plating voltage $V_{P1}$, is applied to bottom surface 34 to produce a plating current $I_{P1}$, that flows through region 29 and silicide layer 51 to electroplate additional platinum over silicide layer 51, thereby forming a layer 46 that increases the overall thickness of conductive material over bottom surface 39. In one embodiment, platinum is plated to form layer 46 to a thickness of about five thousand angstroms. Plating voltage $V_{P1}$ typically is applied uniformly over bottom surface 34 to ensure a uniform distribution of plating current within trench 40 and within trenches of other integrated circuit dice (not shown) fabricated on the same wafer as integrated circuit 10.

Plating voltage $V_{P1}$ is then applied to electroplate a high conductivity material such as copper upwardly from layer 46 to fill trench 40 to a depth of about 0.5 micrometers below the plane of surface 31 to form a conductor 47. Where the high conductivity material is chemically reactive, a conductive barrier layer 48 is formed over conductor 47 with a less chemically active, low resistance material such as platinum to enclose conductor 47 to avoid contaminating other portions of integrated circuit 10 during subsequent processing steps. Conductor 47 and barrier layer 48 are effectively connected in parallel to function as an inductor 50. In one embodiment, barrier layer 48 comprises platinum plated to a surface 49 which is substantially coplanar with surface 31. Such coplanarity avoids metal thinning when covering a large step and therefore facilitates making electrical connection to relatively thick inductor 50 using standard, relatively thin integrated circuit metallization.

The described plating method is not limited to forming inductors, but typically is used to concurrently form other integrated circuit passive components and structures which have a low parasitic capacitance and high frequency response. For example, the plating method is used to form low series resistance capacitor plates, bonding pads and the like.

Note that the above described plating scheme provides a conductive path through region 29 that couples plating voltage $V_{P1}$ from bottom surface 34 of substrate 11 to bottom surface 39 to plate the high conductivity material that forms conductor 47. Hence, plating voltage $V_{P1}$ is applied to a first surface, e.g., bottom surface 34, to plate high conductivity material from a second surface, e.g., bottom surface 39, to form conductor 47 at or adjacent to a third surface of substrate 11, e.g., surface 31. Most if not all existing plating schemes apply a plating voltage at the edge of the top surface of a semiconductor wafer in order to plate a passive component on the top surface. Such schemes typically require that a blanket seed layer be formed on the top surface to receive the plating voltage and an additional photoresist layer be formed and patterned to define the plated region. However, to insure uniform plating, voltage drops must be minimized across the seed layer, which limits the magnitude of the plating current and increases the time needed for completing the plating step, thereby increasing the fabrication cost.

With the plating scheme shown in FIG. 7, virtually equal resistances are maintained between bottom surface 34 and the various trenches to be plated, which allows a higher magnitude of plating current to flow without producing voltage drops that can reduce plating uniformity. The higher plating current results in a shorter plating time, which reduces the fabrication cost of integrated circuit 10. Moreover, a seed layer is not needed for plating inductor 50, which further reduces the fabrication cost.

Figure 8:
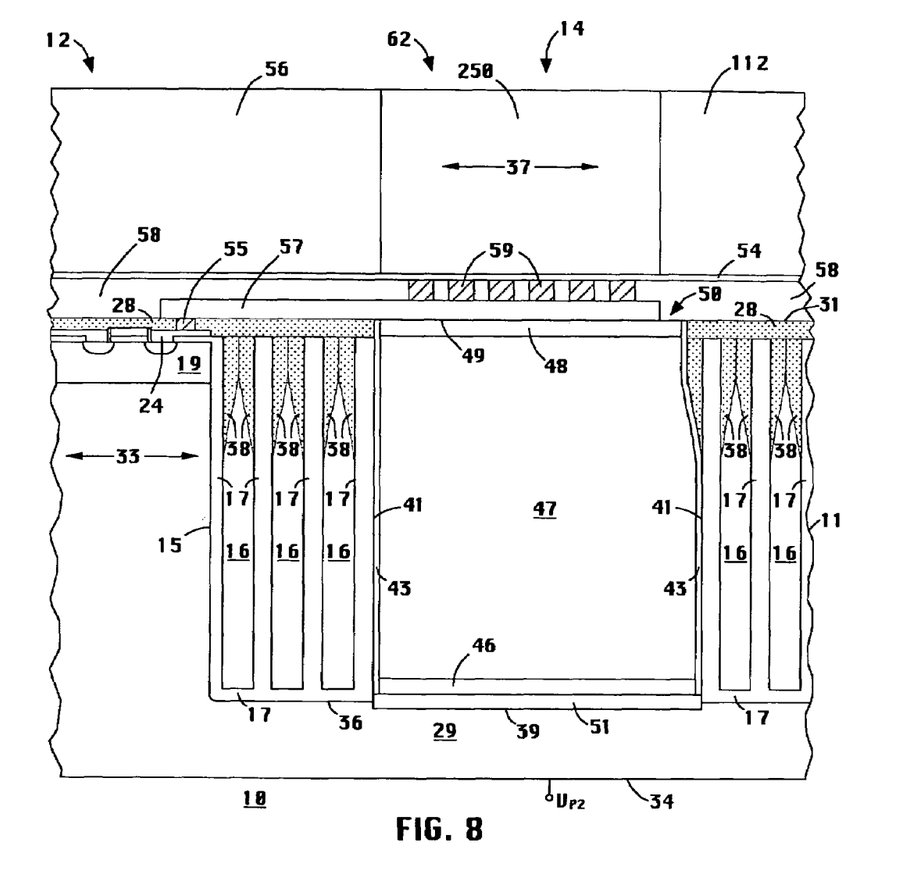
FIG. 8 shows a cross-sectional view of the selected portion of the integrated circuit after a sixth processing step.

FIG. 8 is a cross-sectional view of the selected portion of integrated circuit 10 after a sixth processing step. Dielectric layer 28 is selectively etched through and filled with a conductive material such as copper, tungsten, or aluminum to form a via 55 that electrically contacts drain electrode 24 of transistor 20. In one embodiment, vias 55 are formed with tungsten to a thickness of about 0.5 micrometers. Alternatively, dielectric layer 28 is selectively etched to form a contact opening that exposes drain electrode 24 for contacting directly to an interconnect trace.

A conductive film is deposited over dielectric layer 28 and selectively etched to form a standard integrated circuit interconnect metallization trace 57 as shown to electrically couple drain electrode 24 through via 55 to inductor 50. In one embodiment, trace 57 is formed with copper plated to a thickness of about 0.5 micrometers. As described above, surface 49 of inductor 50 is formed to be substantially coplanar with surface 31, so there is little or no step between dielectric layer 28 and inductor 50. As a result of the coplanarity, trace 57 is formed to directly contact inductor 50 at surface 49 while maintaining a substantially constant thickness. That is, there is little or no thinning of trace 57 due to poor step coverage because there is little or no height difference or step between surface 31 and surface 49. Since there is little or no thinning, trace 57 has a low resistance and a high reliability of integrated circuit 10 is achieved.

Depending on the application and/or the complexity of integrated circuit 10, additional interconnect layers may be formed over trace 57 by alternately depositing and selectively etching interlevel dielectric and conductive films in accordance with standard integrated processing.

A dielectric layer 58 is formed over trace 57 and/or the additional interconnect layers. Dielectric layer 58 is patterned and etched to form openings which are filled with a conductive material to produce an array of vias 59 that contact trace 57. In one embodiment, dielectric layer 58 comprises polyimide formed to a thickness of about ten micrometers and vias 59 comprise plated copper.

Geometrically, inductor 50 is formed as a spiral inductor whose windings lie in a lower level plane 33 running parallel to surface 31. To maintain a small die size while forming a high performance transformer or an inductor with a higher inductance, one or more additional windings are formed in an upper level plane 37 running parallel to surface 31 as follows.

A conductive material is deposited over dielectric layer 58 to form a seed layer 54 that functions as a plating electrode. A thick photoresist layer 56 is formed over seed layer 54 and then exposed and developed to form a trench 62 over vias 59. A plating voltage $V_{P2}$ is applied to bottom surface 34 and coupled through region 29, inductor 50, trace 57 and vias 59 to seed layer 54 to plate a conductive material such as copper within trench 62 to form an inductor 250. The thickness of inductor 250 preferably is at least five micrometers to provide a low series resistance. In one embodiment, inductor 250 is formed to a thickness of about thirty micrometers. Depending on the interconnection scheme, magnetic fields produced by a varying current flowing through inductors 50 and 250 are electromagnetically coupled so that inductors 50 and 250 combine to produce an increased inductance or may be coupled to interact to function as a transformer.

The steps used for forming inductor 250 can also be used to form traces for interconnecting multiple dice mounted in a plane in the same package. In that case, plating voltage $V_{P2}$ is applied to seed layer 54 to plate the conductive material to form inductor 250 and the interconnect traces.

Figure 9:
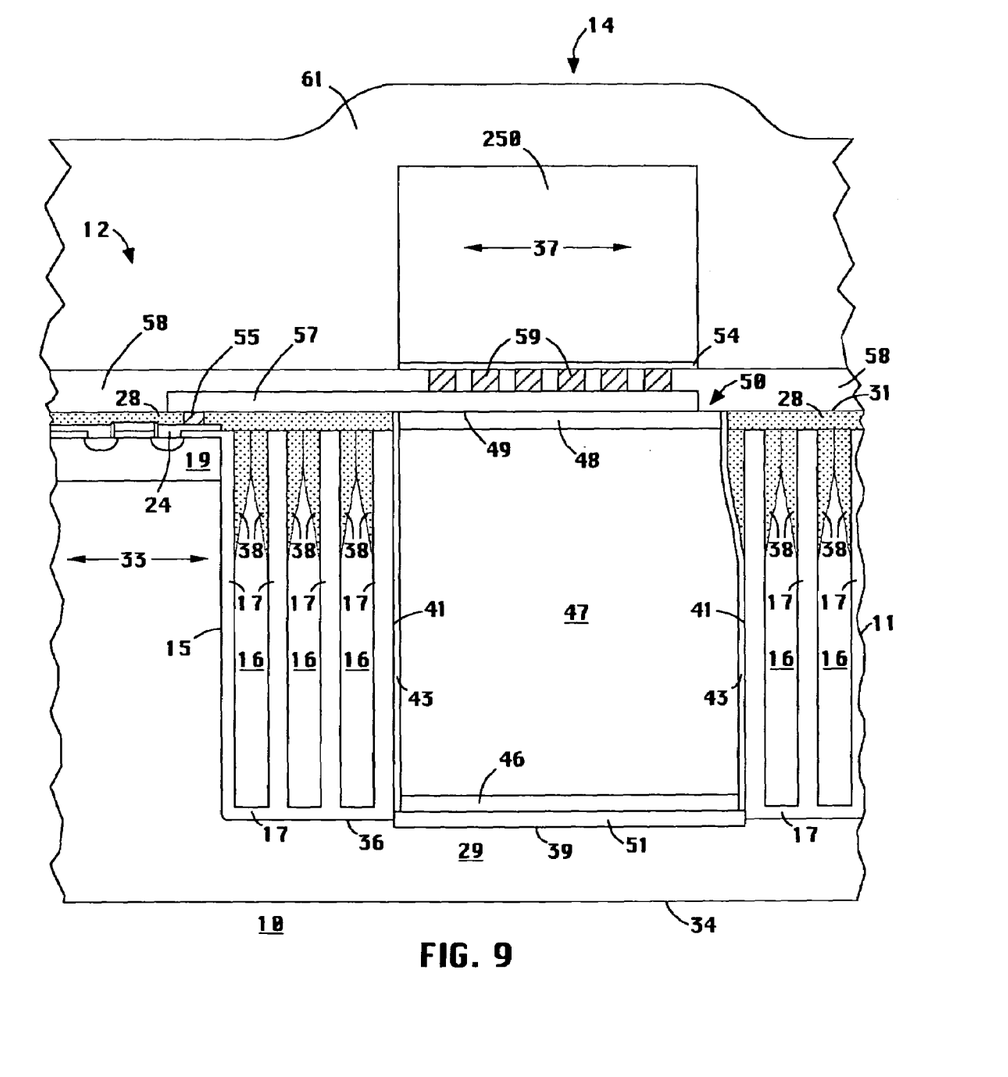
FIG. 9 shows a cross-sectional view of the selected portion of the integrated circuit after a seventh processing step.

FIG. 9 shows a cross-sectional view of the selected portion of integrated circuit 10 after a seventh processing step. Photoresist layer 56 is removed and seed layer 54 is etched to remove the portion not covered by inductor 250. A passivation layer 61 is formed over dielectric layer 58, inductor 250 and other exposed portions of integrated circuit 10. The effective parasitic capacitance of inductor 250 is a function of the thickness and permittivity of passivation layer 61. Hence, in applications where it is advantageous to form inductors 50 and 250 with generally equal parasitic capacitances, the thickness of passivation layer 61 can be adjusted to set the effective interwinding permittivity of inductor 250 to match or equal the effective interwinding permittivity of inductor 50. For example, in an embodiment where windings of inductor 250 are spaced thirty micrometers apart, passivation layer 61 comprises polyimide with a relative permittivity of about 2.8 and a thickness of about twenty-six micrometers to produce a relative interwinding permittivity of about 2.5 to match the effective permittivity of dielectric region 14.

Figure 10:
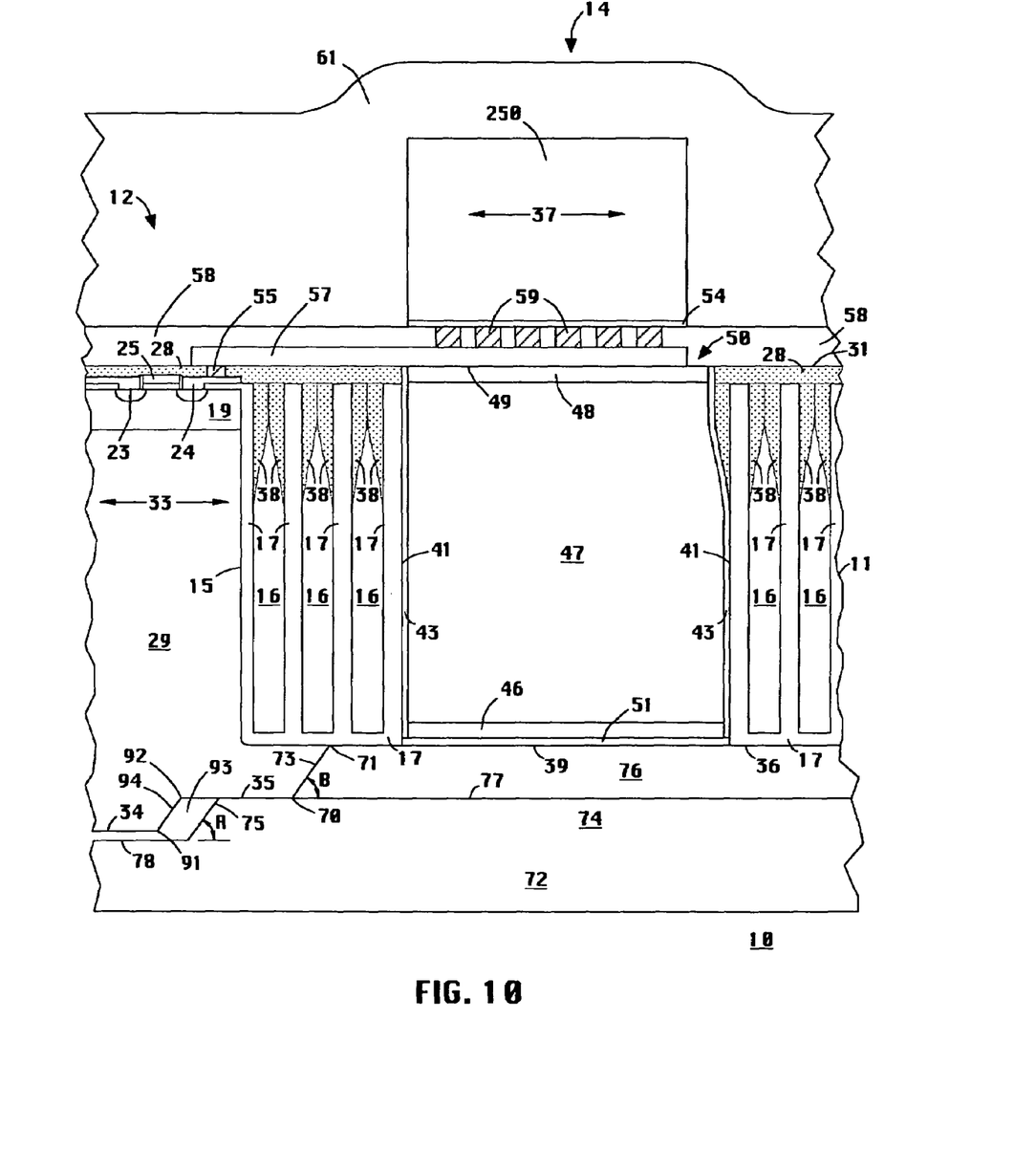
FIG. 10 shows a cross-sectional view of the selected portion of the integrated circuit after an eighth processing step.

FIG. 10 shows a cross-sectional view of the selected portion of integrated circuit 10 after an eighth processing step. Bottom surface 34 is patterned and substrate 11 is selectively etched to form recessed region 93 defined by edges 91 and 92 as indicated above. In one embodiment, substrate 11 is etched so that edges 91 and 92 bound a side surface 94 extending to a surface 35 whose height is about four hundred micrometers above the height of bottom surface 34. Substrate 11 preferably is etched isotropically to produce etched side surface 94 along a crystallographic plane of substrate 11 at a predictable angle A of about 54.7 degrees with respect to the plane of bottom surface 34.

Surface 35 is patterned and etched to remove material from region 29 to form recessed region 76 to extend from surface 35 to silicide layer 51 and/or surface 36 of dielectric material 17. In one embodiment, silicide layer 51 comprises platinum silicide and material is removed from region 29 with an etchant that includes potassium hydroxide. Even if platinum silicide is removed from silicide layer 51 by the potassium hydroxide etchant, virtually zero platinum is consumed from layer 46, which therefore provides a complete etch stop. Silicon dioxide resists etching with potassium hydroxide and therefore functions as a natural etch stop to allow a degree of overetching that ensures that recessed region 76 extends to silicide layer 51 and surface 36, i.e., that silicide layer 51 and surface 36 are exposed. The etching step typically is preferential, which produces an etched surface 73 along a crystallographic plane of substrate 11 at angle B of about 54.7 degrees with respect to the plane of surface 35.

Because the conductive material of region 29 is removed to form recessed region 76, substantially zero parasitic image currents are induced in substrate 11 by changing magnetic fields induced by currents flowing through inductors 50 and 250. As a result, inductors 50 and 250 have higher quality factors than previous integrated inductors. Moreover, there is effectively zero parasitic capacitance to substrate 11, which increases the frequency response of inductors 50 and 250.

Integrated circuit 10 is mounted to a die attach pad 72 of an integrated circuit package which includes a pedestal 74 having side surface 75 formed at angle A for mounting substrate 11. In one embodiment, pedestal 74 does not extend above surface 35, so that recessed region 76 forms a cavity between an upper surface 77 of pedestal 74, which reduces loading of inductors 50 250. In another embodiment, material is removed from pedestal 74 in a region adjacent to surface 77 to further increase the volume of the cavity formed by pedestal 74 and recessed region 76. Recessed region 76 preferably has a height of at least thirty micrometers. In one embodiment, the height of recessed region 76, i.e., the distance between surface 35 and bottom surface 39 is about one hundred micrometers. Recessed region 76 preferably has a height of at least thirty micrometers. In one embodiment, the height of recessed region 76, i.e., the distance between surface 35 and bottom surface 39 is about one hundred micrometers.

Note that a gap is formed between surfaces 75 and 94 and between surfaces 78 and 35 as shown to reduce thermal and/or mechanical stress between substrate 11 and die attach pad 72. The gap may by fully or partially filled with excess die attach material such as gold, solder, or electrically conductive epoxy used to bond surface 35 to surface 77. The die attach material preferably has a high thermal conductivity.

Figure 11:
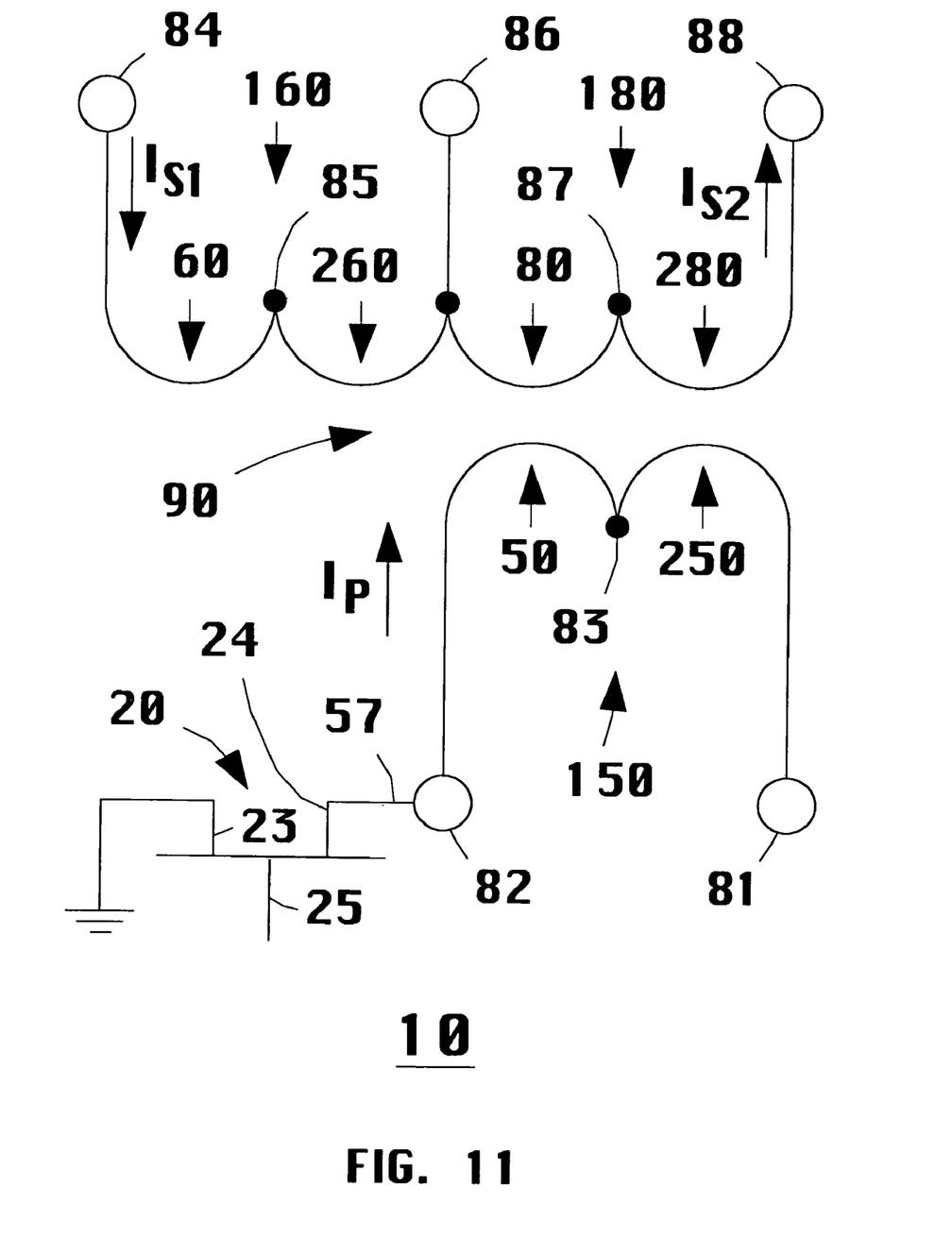
FIG. 11 is a schematic diagram of a portion of the integrated circuit including a transistor and a transformer.

FIG. 11 is a schematic diagram of the selected portion of integrated circuit 10 including transistor 20 and a transformer 90 formed in dielectric region 14.

Transformer 90 has a primary winding 150 that includes a lower portion formed in lower level plane 33 which is designated as inductor 50 and an upper portion formed in upper level plane 37 and designated as inductor 250. Inductor 50 has an electrode 82 for coupling through trace 57 to drain electrode 24 of transistor 20, and an electrode 83 for serially coupling to inductor 250. An electrode 81 is used to contact other circuitry (not shown). A secondary winding 160 has a lower portion formed in lower level plane 33 which is designated as inductor 60, and an upper portion formed in upper level plane 37 which is designated as an inductor 260. Inductor 60 has an electrode 84 for external coupling and an electrode 85 for serially coupling to inductor 260. Inductor 260 is further coupled to a center tap electrode 86 of transformer 90. A secondary winding 180 has a lower portion formed in lower level plane 33 and designated as an inductor 80, and an upper portion formed in upper level plane 37 and designated as an inductor 280. Inductor 80 is coupled to center tap electrode 86 and serially coupled to inductor 280 at an electrode 87. Inductor 280 further includes an electrode 88 for external coupling.

Figure 12:
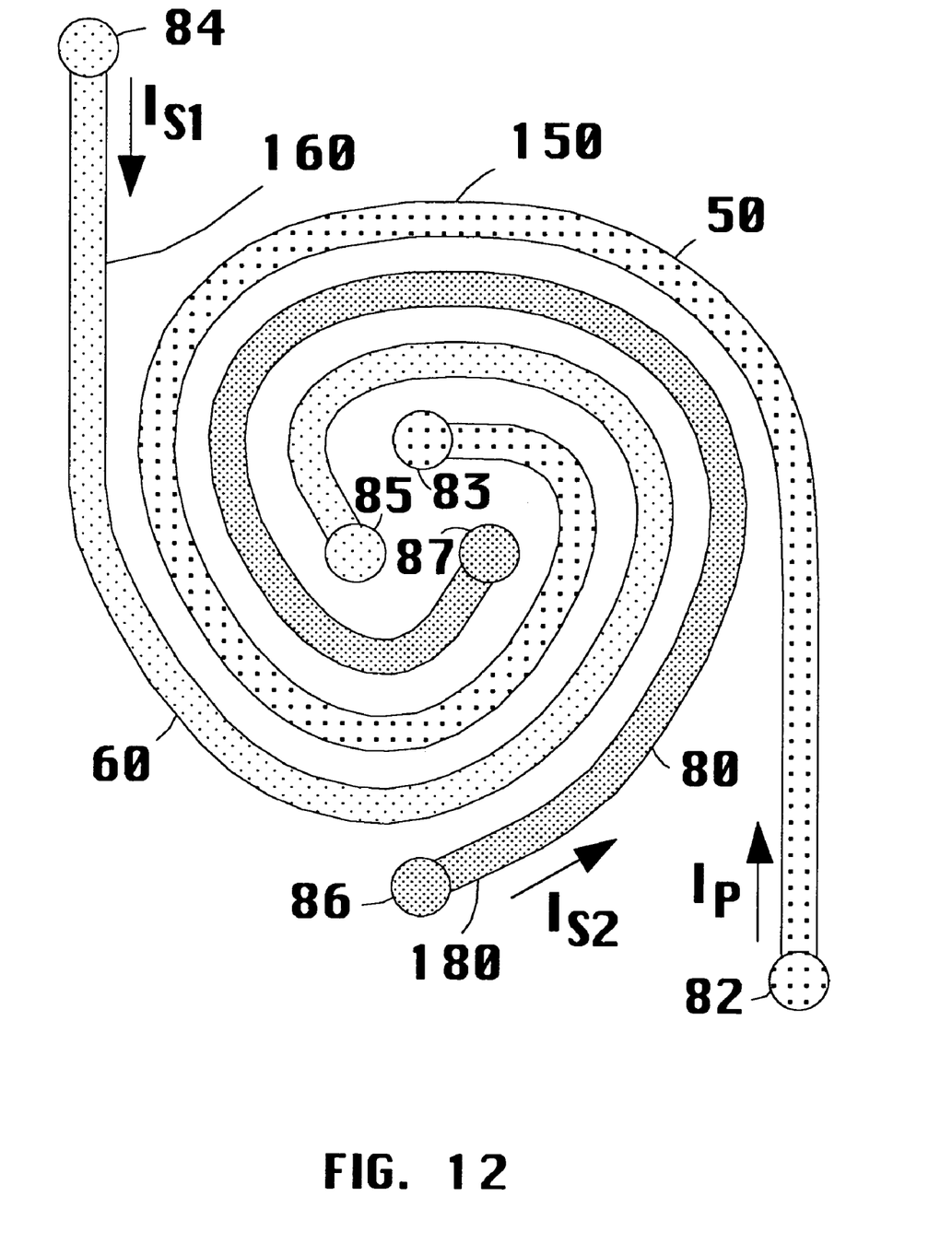
FIG. 12 is a top view of a first portion of the transformer formed in the dielectric region of the integrated circuit.

FIG. 12 is a top view of a first portion of transformer 90 as formed in dielectric region 14 showing features formed in lower level plane 33, including planar spiral inductors 50, 60 and 80. Even though inductors 50, 60 and 80 are formed concurrently in lower level plane 33, they are shown with different fill codes to more clearly show their geometric symmetry.

Primary winding 150 conducts a primary current $I_P$ through inductor 50 from electrode 82 to electrode 83. Current $I_P$ induces a secondary current $I_{S1}$ in secondary winding 160 and a secondary current $I_{S2}$ in secondary winding 180. Secondary current $I_{S1}$ flows through inductor 60 from electrode 85 to electrode 84, while secondary current $I_{S2}$ flows through inductor 80 from electrode 87 to electrode 86 as shown. Electrodes 82–87 include vias similar to vias 55 and/or vias 59 as appropriate for internally and/or externally coupling to transformer 90. For example, electrode 82 comprises one or more of vias 55 for coupling to trace 57 and transistor 20 as shown, while electrode 83 includes one or more of vias 59 for coupling inductor 50 to inductor 250. In one embodiment, the width of inductors 50, 60 and 80 is thirty micrometers and the separation between adjacent inductors is thirty micrometers. Inductor 60 is formed as an outer winding while inductor 80 is formed as an inner winding. Inductor 50 is formed to lie between inductors 60 and 80 so that primary winding 150 is close coupled to both secondary windings 160 and 180. In one embodiment, inductors 60 and 80 are adjusted to have substantially equal lengths to produce substantially equal inductances.

Figure 13:
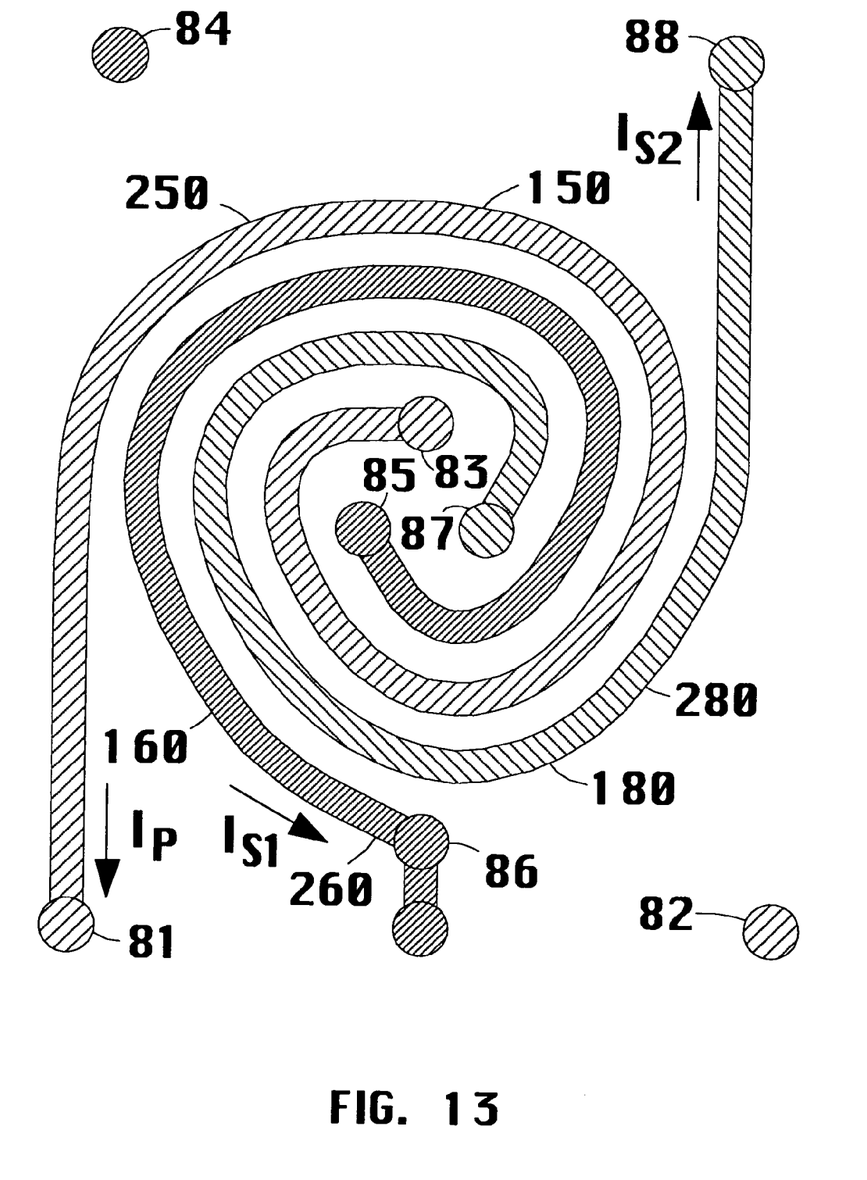
FIG. 13 is a top view of a second portion of the transformer.

FIG. 13 is a top view of a second portion of transformer 90 as formed over dielectric region 14 showing features formed in upper level plane 37. Individual inductors that are formed in upper level plane 37 are shown with different fill codes to more clearly show the current flow through transformer 90. The second portion of transformer 90 is configured similarly to the first portion with three planar spiral windings as shown which are electrically coupled to windings formed in lower level plane 33. Primary current $I_P$ flows from inductor 50 through electrode 83 and inductor 250 and to other circuitry (not shown) at electrode 81. Secondary current $I_{S1}$ flows from inductor 260 at electrode 85 through inductor 60 to center tap electrode 86. Secondary current $I_{S2}$ flows from center tap electrode 86 through inductor 80 to electrode 87 and through inductor 280 to electrode 88 for external coupling.

Inductor 260 is formed as an inner winding while inductor 280 is formed as an outer winding and inductor 250 is formed to lie between inductors 260 and 280. Hence, inductor 60 of secondary winding 160 is formed as an outer winding while inductor 260 is formed as an inner winding. Similarly, inductor 80 of secondary winding 180 is formed as an inner winding while inductor 280 is formed as an outer winding. In one embodiment, inductors 60 and 80 are adjusted to have substantially equal lengths to produce substantially equal inductances. Alternatively, transformer 90 can be configured so that a difference in the inductances of inductors 260 and 80 is compensated by a comparable difference in the inductances of inductors 60 and 280, so that secondary windings 160 and 180 have substantially equal or matched inductances.

Hence, transformer 90 is formed so the geometries of the upper and lower portions of transformer 90 are selected to provide total inductances of secondary windings 160 and 180 which are substantially equal. A greater length of inductor 60 over inductor 80 in the lower portion of transformer 90 is offset by a greater length of inductor 280 over inductor 260 in the upper portion of transformer 90. Conversely, a greater length of inductor 260 may be offset by a similarly greater length of inductor 280. The parasitic capacitances of inductors 60 and 80 are balanced with the respective parasitic capacitances of inductors 260 and 280 by adjusting the thickness of passivation layer 61. As a result, transformer 90 is suitable for use as a high performance balun in a wireless communication device to convert a single ended six gigahertz radio frequency signal through primary winding 150 to a balanced differential signal across secondary windings 160 and 180.

Figure 14:
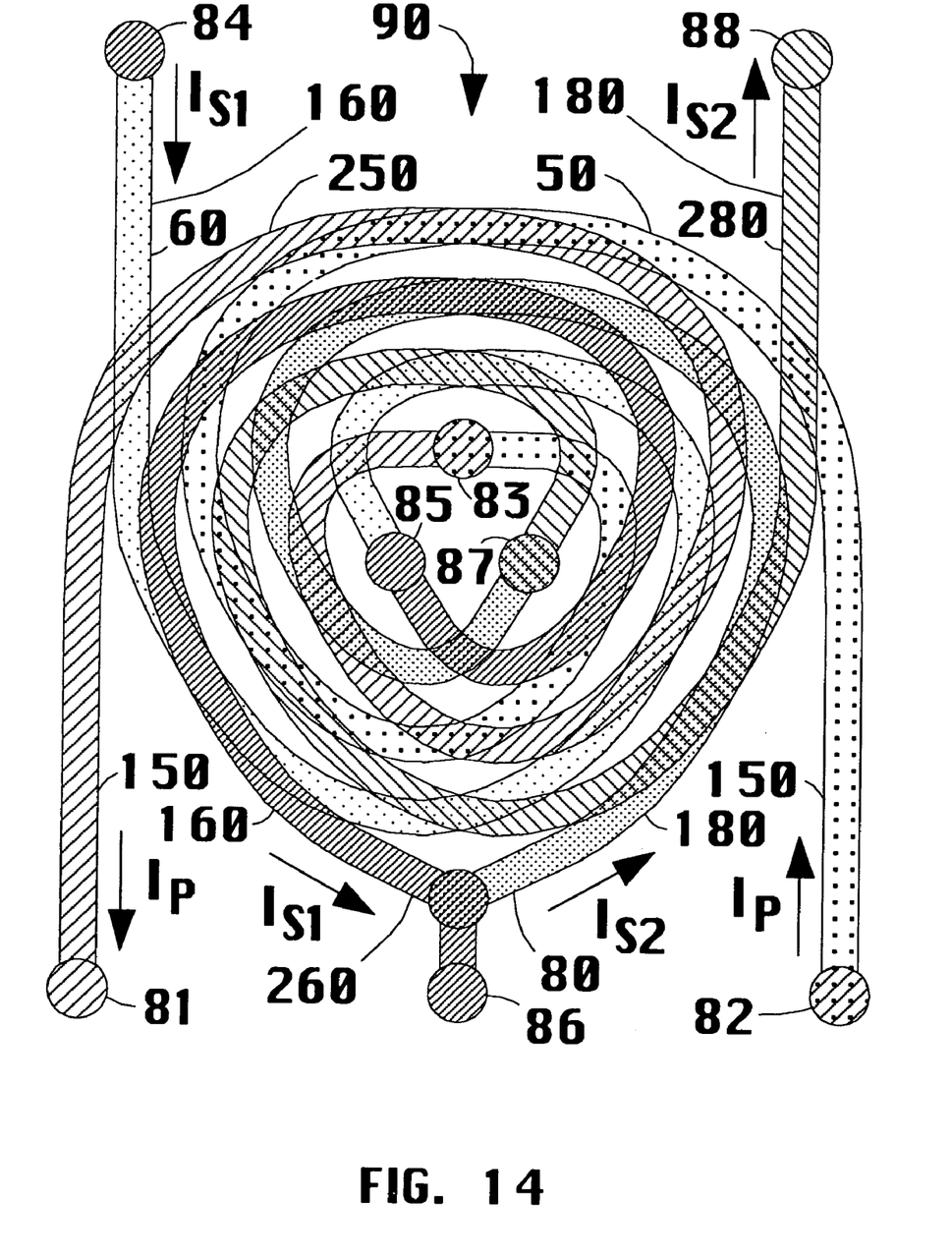
FIG. 14 is a top view of the transformer showing the relationship of the first and second portions of the transformer.

FIG. 14 is a top view of transformer 90 showing the upper and lower portions of windings 150, 160 and 180 in one view to more clearly indicate the relationship between windings formed on lower level plane 33 and upper level plane 37. Note that although inductors 50, 60, 80, 250, 260 and 280 are formed as described above, each is shown with a unique fill code to more clearly indicate the symmetry of windings 150, 160 and 180. In summary, the present invention provides an integrated circuit that has a dielectric region formed with a trench and one or more cavities. A conductive material such as copper is disposed within the trench to produce an inductor with a high inductance and low series resistance. The trench is preferably at least five micrometers deep, so windings of the inductor have a large cross section and surface area, which produces the low series resistance. Moreover, the cavity in the dielectric region reduces the effective dielectric constant or permittivity, so the inductor has a low parasitic capacitance and high frequency response. The inductor is formed in the trench so that its top surface is substantially coplanar with the surface used to form interconnect traces of the integrated circuit, which allows the inductor to be electrically contacted using standard metal interconnect techniques.

What is claimed is:
1. An integrated circuit comprising:
a low resistivity, semiconductor substrate with a planar surface, the substrate including a dielectric region having a portion defined in and extending parallel with the planar surface;
an elongated trench formed in the dielectric region and including side-walls defined by a composite dielectric material, the composite dielectric material including a first dielectric material with a first dielectric constant and a second dielectric material with a second dielectric constant lower than the first dielectric constant and the first dielectric material and the second dielectric material intermixed to form an effective dielectric constant lower than the first dielectric constant, the elongated trench extending parallel with the planar surface of the semiconductor substrate a distance defining at least one inductor of an inductive device;
conductive material positioned in the trench and forming the at least one inductor of the inductive device; and
a conductive trace on the planar surface electrically connecting the at least one inductor of the inductive device to external circuitry.

2. An integrated circuit as claimed in claim 1 further including at least one active component positioned in an active region of the low resistivity, semiconductor substrate and coupled to the inductive device.

3. An integrated circuit as claimed in claim 1 further including a thin conductive barrier layer positioned on an upper surface of the high conductivity material in the trench so as to have an upper surface coplanar with the planar surface of the semiconductor substrate.

4. An integrated circuit as claimed in claim 1 further including a cavity defined at least partially by the substrate and positioned in underlying relationship adjacent the elongated trench, the cavity and the side-walls electrically and inductively separating the one inductor of the inductive device from the semiconductor substrate.

5. An integrated circuit as claimed in claim 1 wherein the dielectric region includes dielectric material defining an array of cavities therein, the dielectric material having a first dielectric constant and the cavities providing a second dielectric constant lower than the first dielectric constant to form an effective dielectric constant lower than the first dielectric constant.

6. An integrated circuit as claimed in claim 1 wherein the inductive device includes a plurality of similar inductors formed in the dielectric region.

7. An integrated circuit as claimed in claim . 1 wherein the inductive device further includes at least a second inductor extending parallel with and in overlying relationship to the planar surface of the semiconductor substrate, the second inductor overlying the first inductor and separated from the first inductor by a layer of dielectric material.

8. An integrated circuit as claimed in claim 7 wherein the first inductor and the second inductor are wound in the same direction.

9. An integrated circuit as claimed in claim 8 wherein the inductive device includes a transformer.

10. An integrated circuit as claimed in claim 7 wherein the high conductivity material positioned in and substantially filling the trench defining the first inductor includes electroplated copper and the second inductor includes electroplated copper.

11. An integrated circuit comprising:
a low resistivity, semiconductor substrate with a planar surface, the substrate including an active region and a dielectric region each having a portion defined in and extending parallel with the planar surface;

the dielectric region including a volume filled with dielectric material surrounding and defining an array of cavities, the dielectric material having a first dielectric constant and the cavities providing a second dielectric constant lower than the first dielectric constant to form an effective dielectric constant lower than the first dielectric constant;

at least one active component positioned in the active region;

an elongated trench formed in the dielectric region and including side-walls defined by the effective dielectric constant material, the elongated trench extending parallel with the planar surface of the semiconductor substrate a distance defining one inductor of an inductive device;

conductive material positioned in the trench and forming the one inductor of the inductive device; and a conductive trace on the planar surface electrically connecting the one inductor of the inductive device and the at least one active component.

12. An integrated circuit as claimed in claim 11 further including a thin conductive barrier layer positioned on an upper surface of the conductive material in the trench so as to have an upper surface coplanar with the planar surface of the semiconductor substrate.

13. An integrated circuit as claimed in claim 11 further including a cavity defined at least partially by the substrate and positioned in underlying relationship adjacent the elongated trench, the cavity and the side-walls electrically and spacially separating the one inductor of the inductive device from the semiconductor substrate.

14. An integrated circuit as claimed in claim 11 wherein the inductive device further includes at least a second inductor extending parallel with and in overlying relationship to the planar surface of the semiconductor substrate, the second inductor overlying the first inductor and separated from the first inductor by a layer of dielectric material and the first inductor and the second inductor being wound in the same direction.

15. An integrated circuit comprising:

a low resistivity, semiconductor substrate with a planar surface, the substrate including an active region and a dielectric region each having a portion defined in and extending parallel with the planar surface;

the dielectric region including a volume filled with dielectric material surrounding and defining an array of cavities, the dielectric material having a first dielectric constant and the cavities providing a second dielectric constant lower than the first dielectric constant to form an effective dielectric constant lower than the first dielectric constant;

at least one active component positioned in the active region;

an elongated trench formed in the dielectric region and including side-walls defined by the effective dielectric constant material, the elongated trench extending parallel with the planar surface of the semiconductor substrate a distance defining one inductor of an inductive device;

conductive material positioned in the trench and forming the one inductor of the inductive device;

a cavity defined at least partially by the substrate and positioned in underlying relationship adjacent the elongated trench, the cavity and the side-walls electrically and spacially separating the one inductor of the inductive device from the semiconductor substrate; and a conductive trace on the planar surface electrically connecting the one inductor of the inductive device and the at least one active component.

16. An integrated circuit as claimed in claim 15 further including a thin conductive barrier layer positioned on an upper surface of the conductive material in the trench so as to have an upper surface coplanar with the planar surface of the semiconductor substrate.

17. An integrated circuit as claimed in claim 15 wherein the inductive device includes a plurality of similar inductors formed in the dielectric region.

18. An integrated circuit as claimed in claim 15 wherein the inductive device further includes at least a second inductor extending parallel with and in overlying relationship to the planar surface of the semiconductor substrate, the second inductor overlying the first inductor and separated from the first inductor by a layer of dielectric material.

19. An integrated circuit as claimed in claim 18 wherein the first inductor and the second inductor are wound in the same direction.

20. An integrated circuit as claimed in claim 19 wherein the inductive device includes a transformer.

21. An integrated circuit as claimed in claim 18 wherein the conductive material positioned in and substantially filling the trench defining the first inductor includes electroplated copper and the second inductor includes electroplated copper.

22. An integrated circuit comprising:

a semiconductor substrate with a planar surface, the substrate including a dielectric region having a portion defined in and extending parallel with the planar surface;

an elongated trench formed in the dielectric region and including side-walls defined by low dielectric constant material, the low dielectric constant material having a dielectric constant lower than the dielectric constant of silicon dioxide, the elongated trench extending parallel with the planar surface of the semiconductor substrate a distance defining at least one inductor of an inductive device;

conductive material positioned in the trench and forming the one inductor of the inductive device;

at least a second inductor extending parallel with and in overlying relationship to the planar surface of the semiconductor substrate, the second inductor overlying the first inductor and separated from the first inductor by a layer of dielectric material; and the first inductor and the second inductor being wound in the same direction.

23. An integrated circuit as claimed in claim 22 wherein the inductive device includes a plurality of first inductors and a plurality of second inductors interconnected to form a single inductive device.

* * * * *